(12) United States Patent
Tazawa et al.

(10) Patent No.: US 11,222,875 B2
(45) Date of Patent: Jan. 11, 2022

(54) DISPLAY APPARATUS

(71) Applicant: SONY CORPORATION, Tokyo (JP)

(72) Inventors: Hiroshi Tazawa, Kanagawa (JP); Kotaro Shima, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/610,604

(22) PCT Filed: Apr. 20, 2018

(86) PCT No.: PCT/JP2018/016244
§ 371 (c)(1),
(2) Date: Nov. 4, 2019

(87) PCT Pub. No.: WO2018/207590
PCT Pub. Date: Nov. 15, 2018

(65) Prior Publication Data
US 2020/0066688 A1    Feb. 27, 2020

(30) Foreign Application Priority Data

May 12, 2017    (JP) .............................. JP2017-095294

(51) Int. Cl.
*H01L 33/00*    (2010.01)
*H01L 25/075*    (2006.01)
(Continued)

(52) U.S. Cl.
CPC .......... *H01L 25/0753* (2013.01); *H01L 33/44* (2013.01); *H01L 33/58* (2013.01);
(Continued)

(58) Field of Classification Search
CPC ..... H01L 25/0753; H01L 33/44; H01L 33/58; H01L 33/62; G02B 1/11; G02B 5/0221
See application file for complete search history.

(56) References Cited

U.S. PATENT DOCUMENTS

2004/0080938 A1*   4/2004   Holman ............ G02F 1/133605
                                                 362/231
2012/0092773 A1    4/2012   Liu et al.
(Continued)

FOREIGN PATENT DOCUMENTS

CN    101067704 A    11/2007
CN    101119602 A    2/2008
(Continued)

OTHER PUBLICATIONS

International Search Report and Written Opinion of PCT Application No. PCT/JP2018/016244, dated Jul. 24, 2018, 10 pages of ISRWO.
(Continued)

*Primary Examiner* — Victor A Mandala
*Assistant Examiner* — Colleen E Snow
(74) *Attorney, Agent, or Firm* — Chip Law Group

(57) ABSTRACT

[Object] To provide a display apparatus that makes it possible to improve visibility. [Solution] A display apparatus according to an embodiment of the present disclosure includes: a display body device including a plurality of pixels, the plurality of pixels each including a plurality of light-emitting elements as light source elements; and an irregular structure formed on a front surface of the display body device.

14 Claims, 10 Drawing Sheets

(51) Int. Cl.
*H01L 33/62* (2010.01)
*H01L 33/44* (2010.01)
*H01L 33/58* (2010.01)
*G02B 1/11* (2015.01)
*G02B 5/02* (2006.01)

(52) U.S. Cl.
CPC ............ *H01L 33/62* (2013.01); *G02B 1/11* (2013.01); *G02B 5/0221* (2013.01)

(56) References Cited

U.S. PATENT DOCUMENTS

| | | |
|---|---|---|
| 2013/0037828 A1 | 2/2013 | Moon |
| 2013/0222907 A1 | 8/2013 | Inomata et al. |
| 2014/0203248 A1 | 7/2014 | Zhou |
| 2015/0260882 A1 | 9/2015 | Furui et al. |
| 2015/0285965 A1* | 10/2015 | Horwath ............... G02B 1/11 359/833 |
| 2016/0370505 A1 | 12/2016 | Koo et al. |
| 2017/0103926 A1* | 4/2017 | Aoyagi ............... H01L 33/58 |

FOREIGN PATENT DOCUMENTS

| | | |
|---|---|---|
| CN | 101878436 A | 11/2010 |
| CN | 103069307 A | 4/2013 |
| CN | 103325809 A | 9/2013 |
| CN | 102472937 A | 10/2014 |
| CN | 102854680 A | 2/2015 |
| CN | 104834142 A | 8/2015 |
| CN | 104915050 A | 9/2015 |
| CN | 104979451 A | 10/2015 |
| CN | 102903857 A | 7/2016 |
| CN | 106530971 A | 2/2019 |
| CN | 104777641 A | 5/2020 |
| DE | 102014202206 A1 | 6/2019 |
| JP | 2003-156606 A | 5/2003 |
| JP | 2003-282255 A | 10/2003 |
| JP | 2010-276829 A | 12/2010 |
| JP | 2011-002759 A | 1/2011 |
| JP | 2014-016602 A | 1/2014 |
| JP | 2015-172641 A | 10/2015 |
| JP | 2016-130846 A | 7/2016 |
| KR | 10-2013-0137161 A | 12/2013 |
| KR | 10-2015-0106345 A | 9/2015 |
| KR | 10-2016-0149847 A | 12/2016 |
| TW | 201213137 | 4/2012 |
| TW | 201539281 A | 10/2015 |
| WO | 2012/026497 A1 | 3/2012 |
| WO | 2017032130 A1 | 3/2017 |

OTHER PUBLICATIONS

Office Action issued in Chinese Patent Appln. No. 201880030053.4, dated Mar. 8, 2021.
Chinese Journal of Liquid Crystals and Displays》 ,vol. 31 No. 7. 20160731,Hou Liu qiang etc. Continuous viewing angle controllable liquid crystal display with wide viewing angle and fast response. p. 661-666,1-3.
Notification to Grant Patent Right for Invention for CN Application No. 20180030053.4 dated Sep. 1, 2021.

* cited by examiner

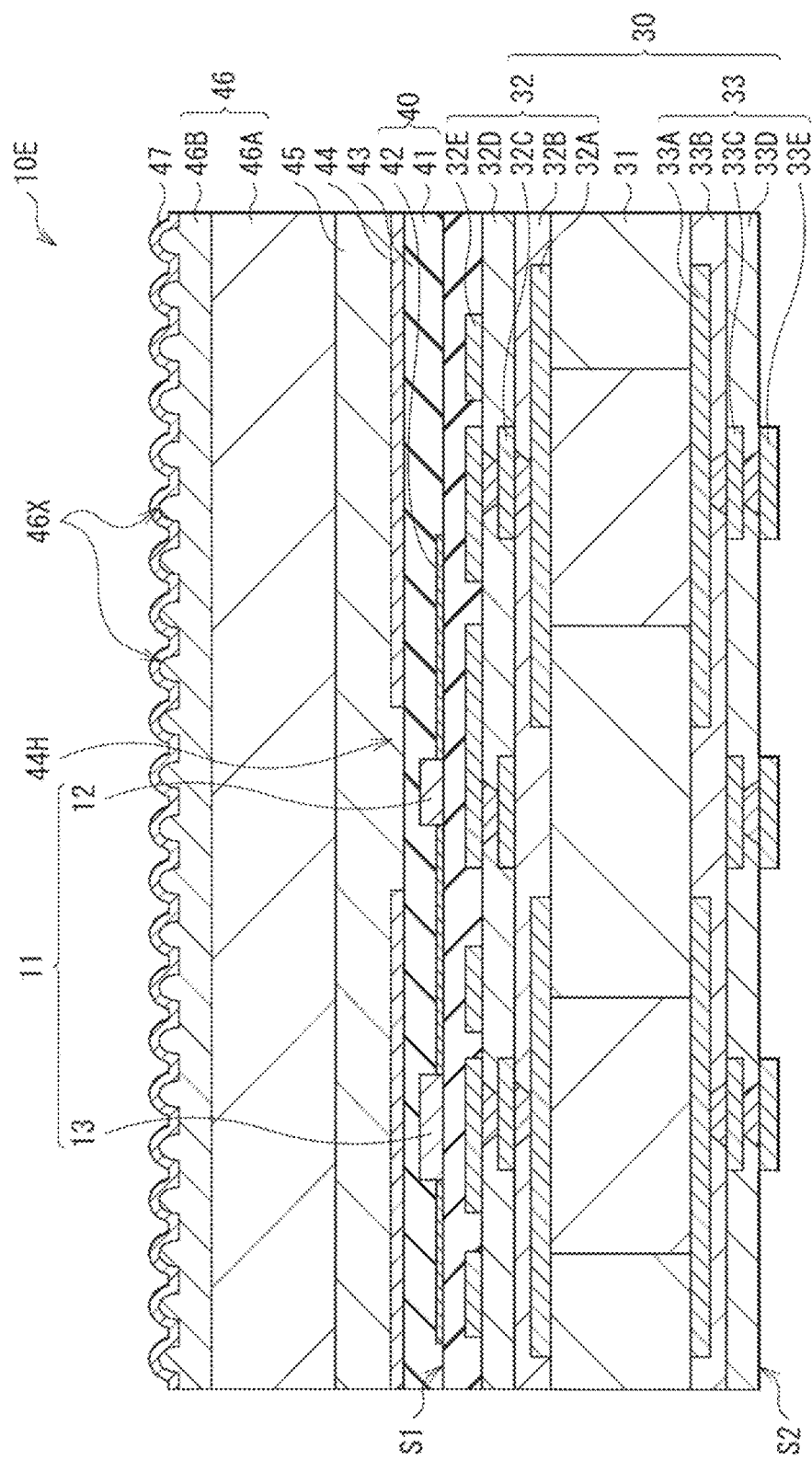

[FIG. 2]
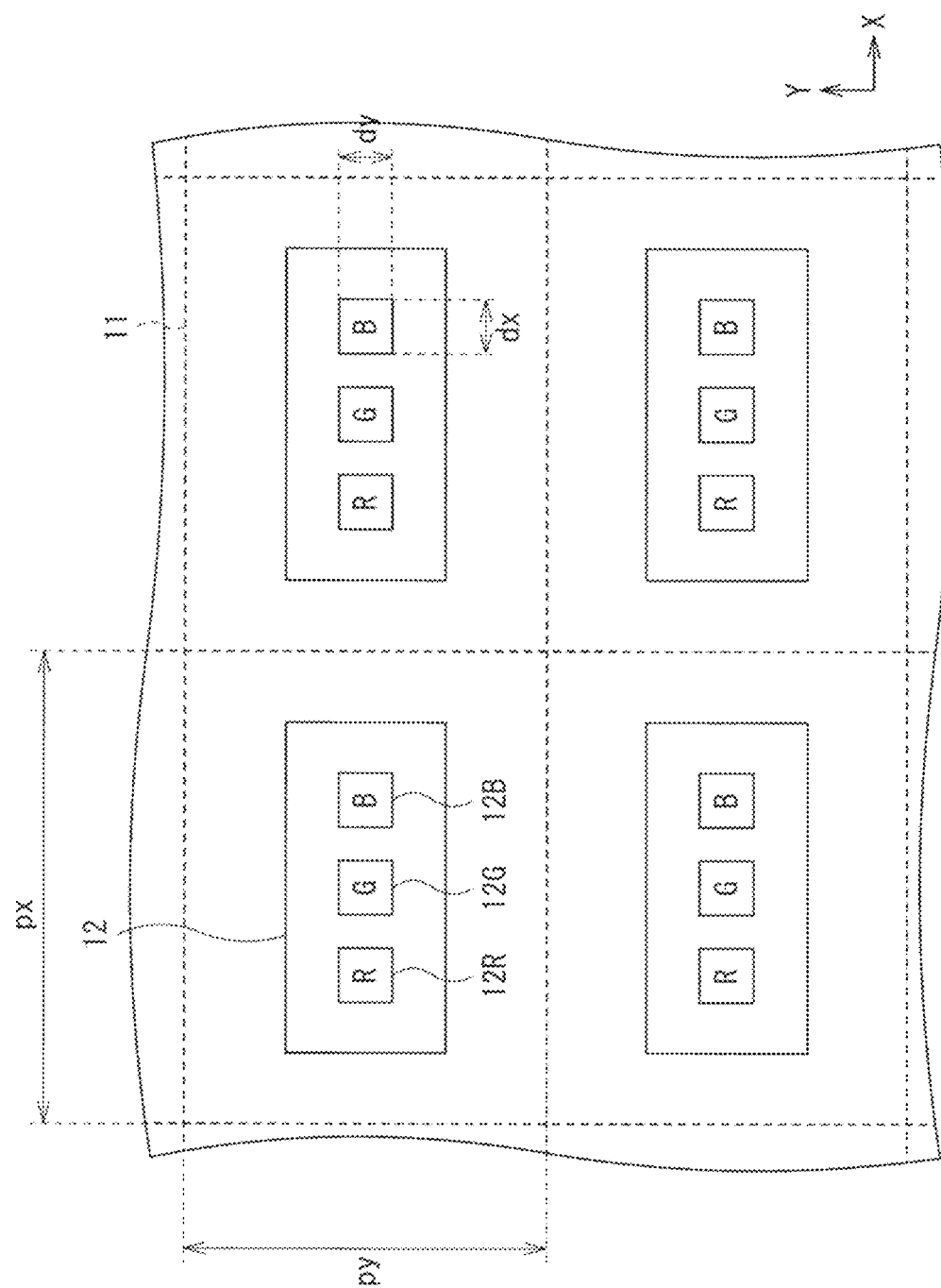

[FIG. 3]
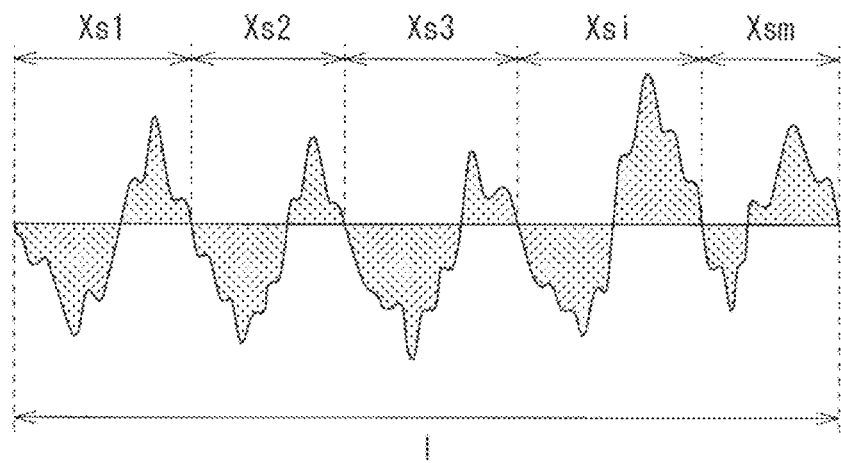
[FIG. 4]
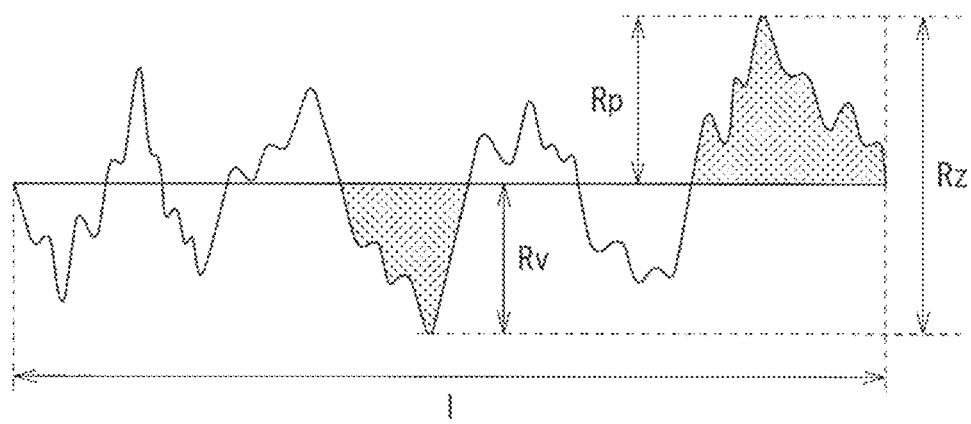

[FIG. 5]
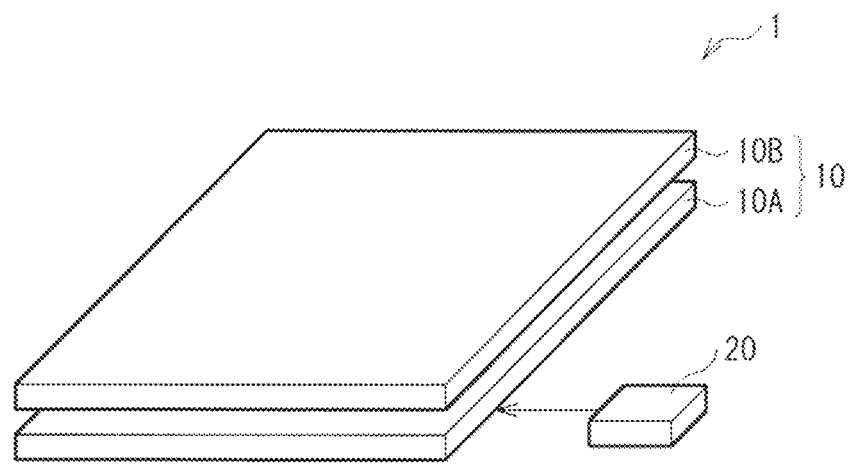

[FIG. 6]
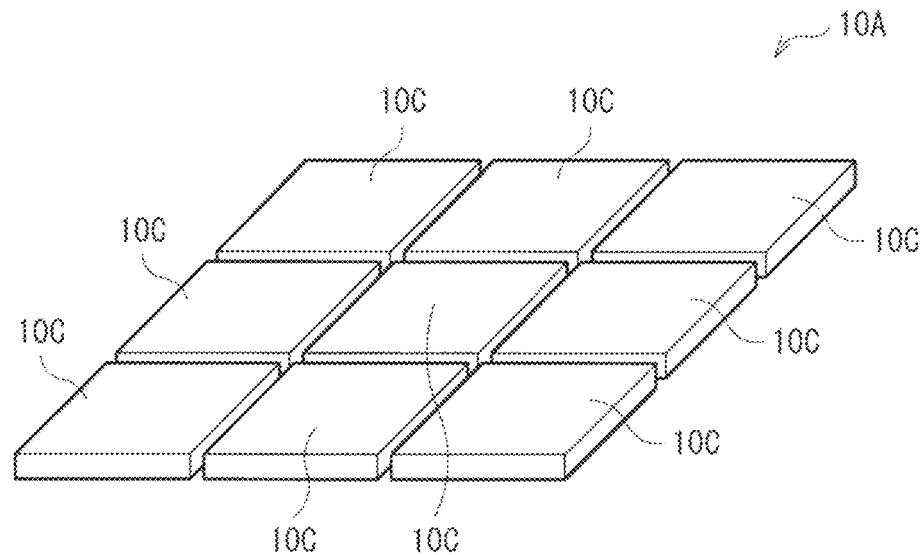
[FIG. 7]
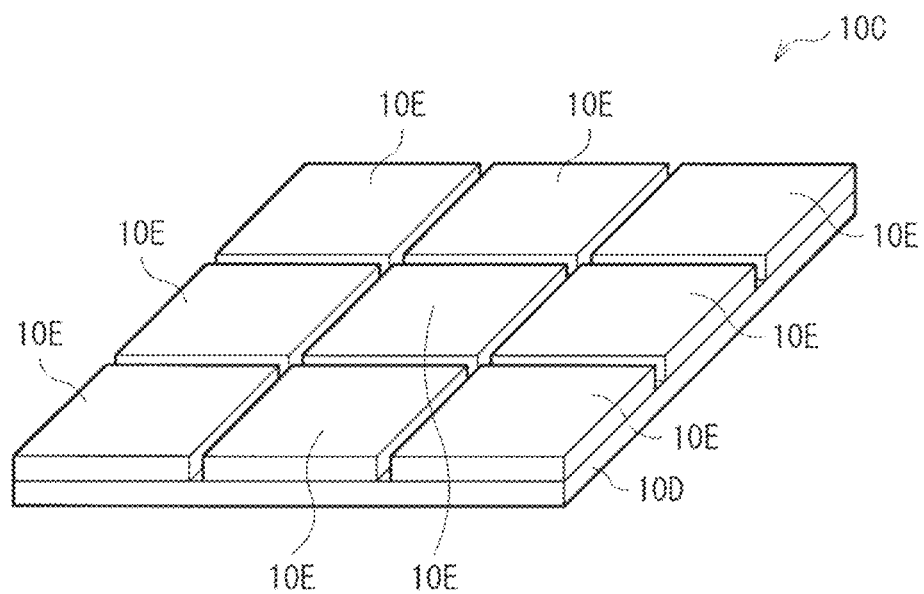

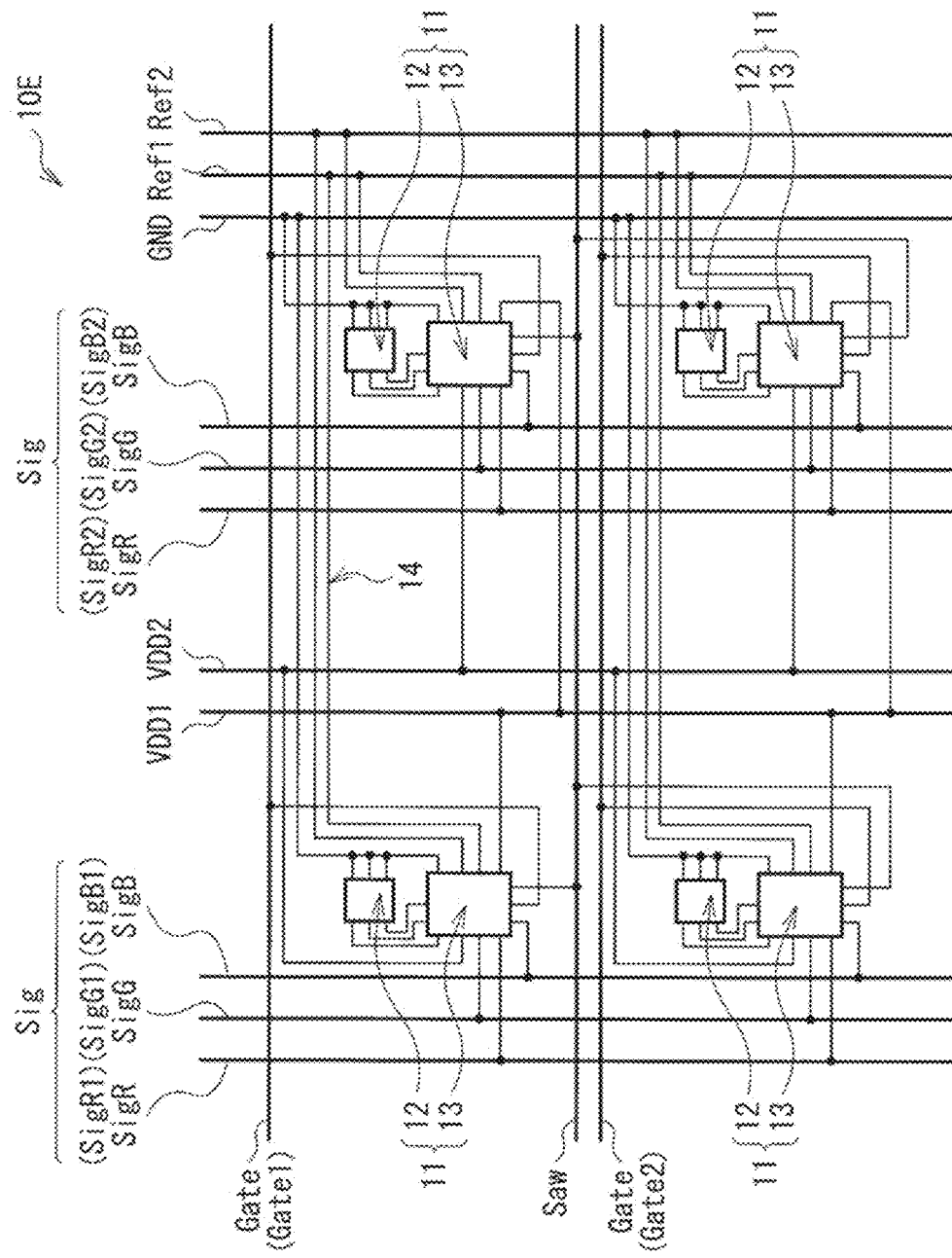
[FIG. 8]

[FIG. 9]
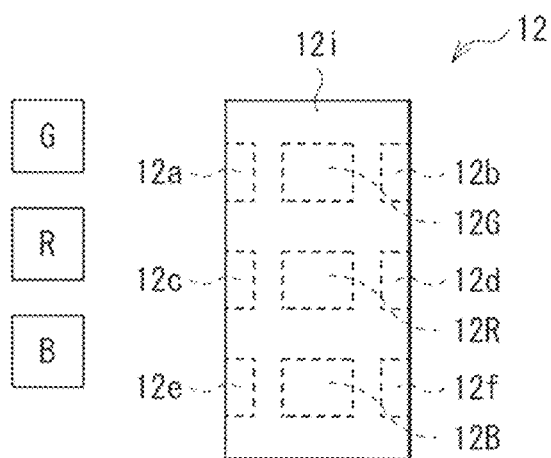
[FIG. 10]
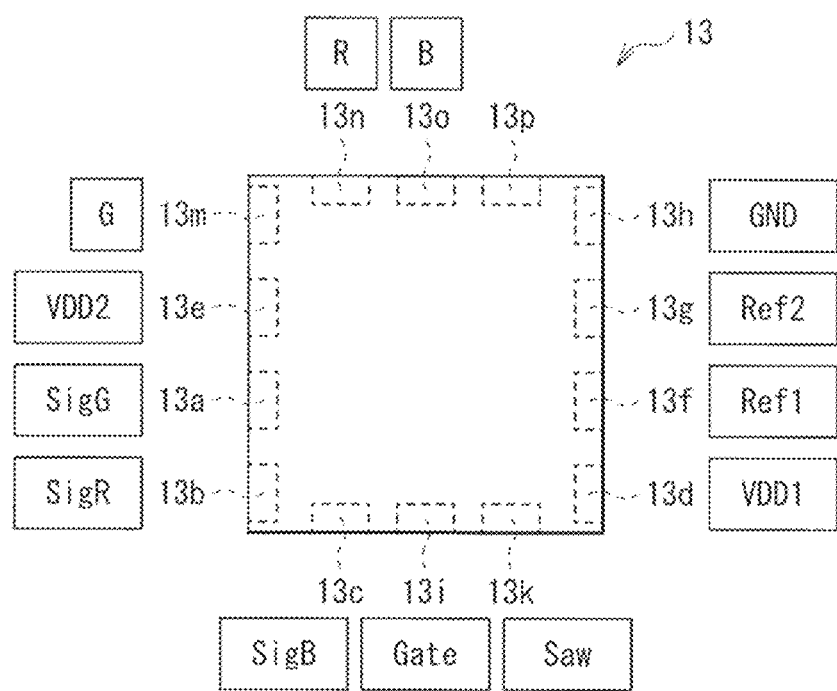

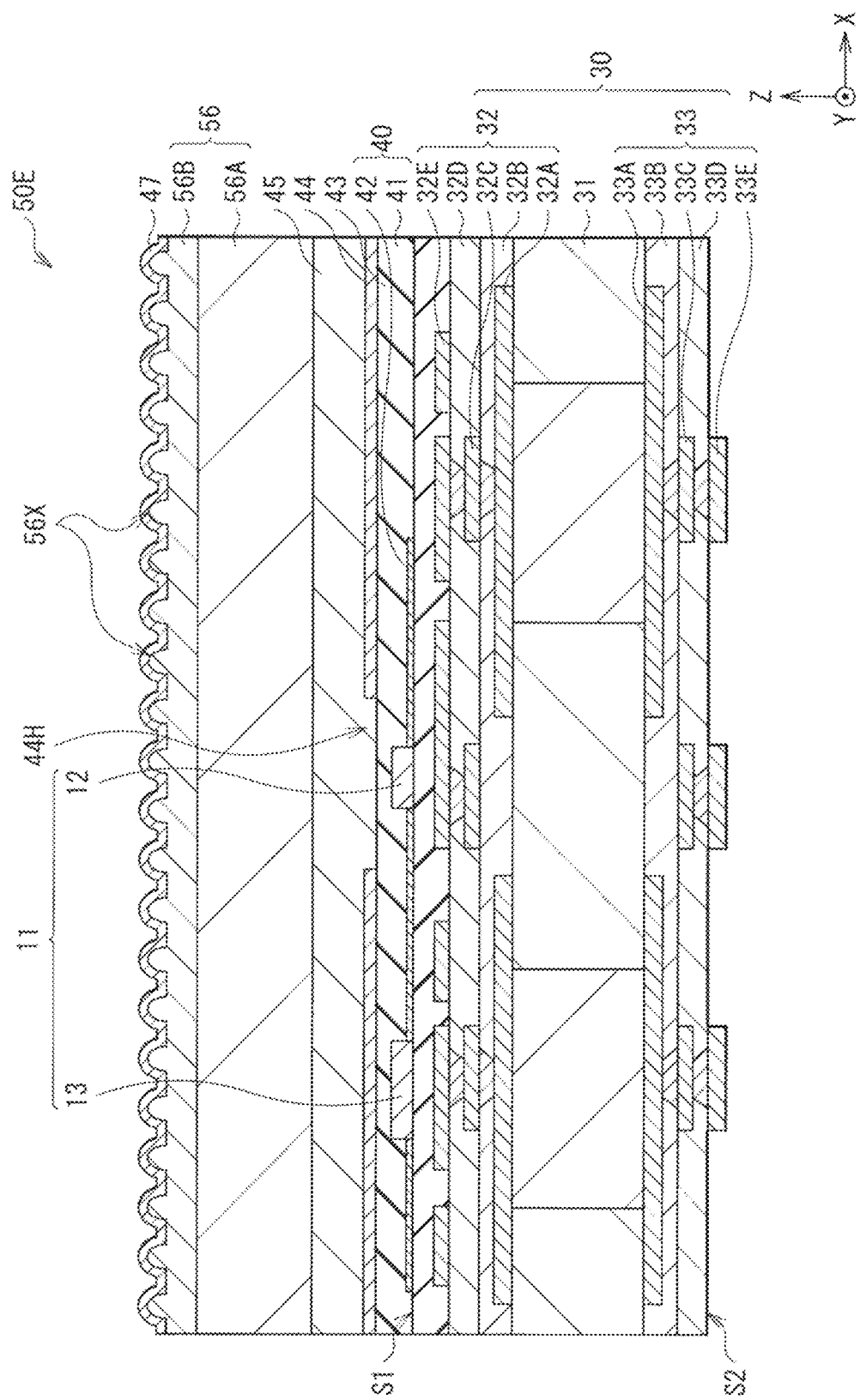
[FIG. 11]

[FIG. 12]
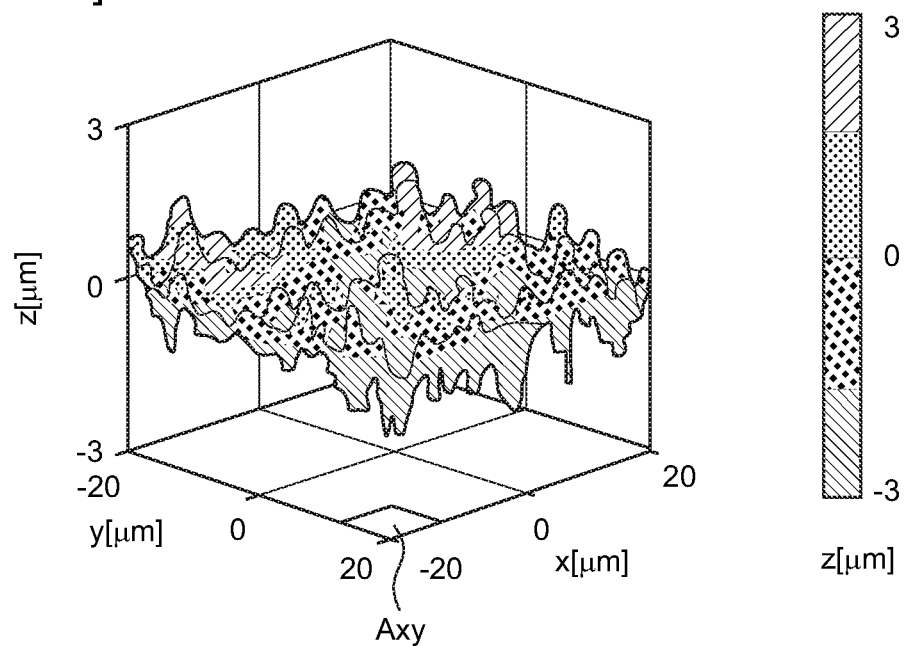
[FIG. 13]
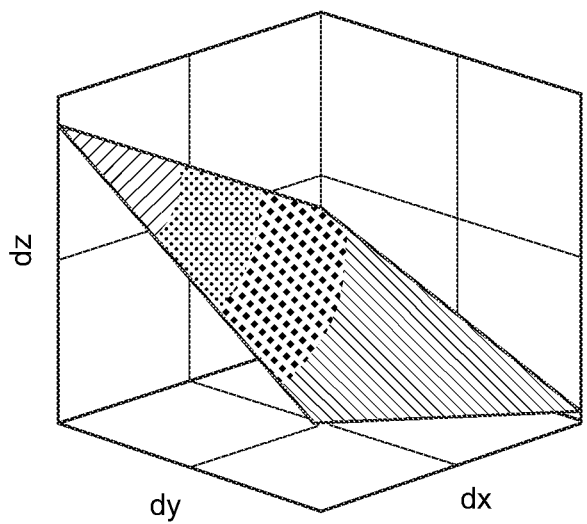

[FIG. 14]
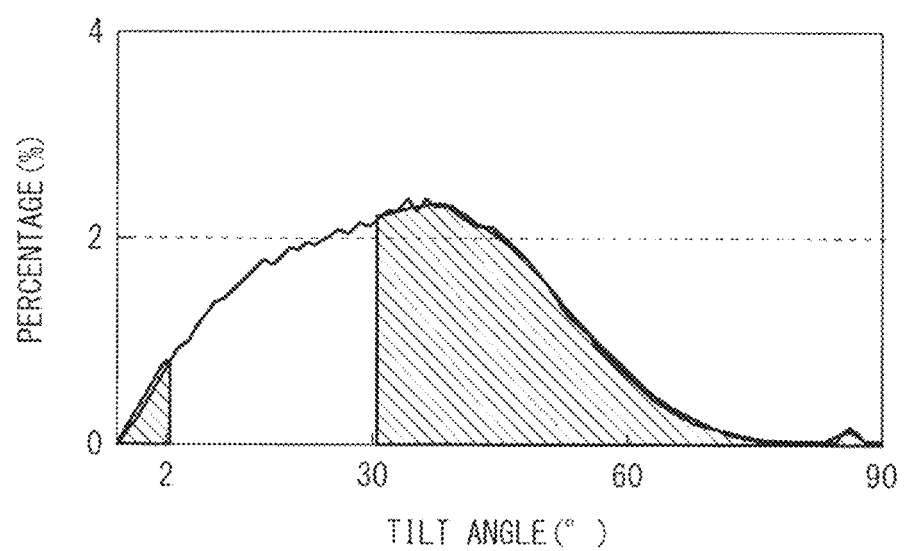

DISPLAY APPARATUS

CROSS REFERENCE TO RELATED APPLICATIONS

This application is a U.S. National Phase of International Patent Application No. PCT/JP2018/016244 filed on Apr. 20, 2018, which claims priority benefit of Japanese Patent Application No. JP 2017-095294 filed in the Japan Patent Office on May 12, 2017. Each of the above-referenced applications is hereby incorporated herein by reference in its entirety.

TECHNICAL FIELD

The present disclosure relates to a display apparatus using, for example, a light-emitting diode as a light source element.

BACKGROUND ART

As devices that display an image, various display apparatuses such as liquid crystal displays, organic EL displays, and light-emitting diode (LED) displays have been developed and are widely used. These display apparatuses use, as technology for improving image quality, a technique of giving an antireflection function and a technique of scattering reflected light in order to reduce reflection by external light. It is possible to give the antireflection function and the function of scatting reflected light respectively by an antireflection film and an antiglare film, for example.

The antireflection film, however, uses a thin film interference effect, and thereby has incident angle dependence, which causes an issue that reflection from an oblique direction becomes large. The antiglare film has irregularities formed on a surface to scatter reflected light, thereby reducing reflection. For example, PTL 1 discloses a glareproof film formed using silica microparticles, organic microparticles, and a binder resin. It is expectable that the antiglare film has a certain effect also on oblique light, as compared with the antireflection film.

CITATION LIST

Patent Literature

PTL 1: Japanese Unexamined Patent Application Publication No. 2014-16602

SUMMARY OF THE INVENTION

Problem to be Solved by the Invention

Incidentally, in display apparatuses, definition becomes higher, with which, for example, phenomena called color breakup, glare, and sparkling have been confirmed. The phenomena described above cause a decrease in viewability; therefore, an improvement in viewability is desired.

It is desirable to provide a display apparatus that makes it possible to improve viewability.

Means for Solving the Problem

A display apparatus according to an embodiment of the present disclosure includes: a display body device including a plurality of pixels, the plurality of pixels each including a plurality of light-emitting elements as light source elements; and an irregular structure formed on a front surface of the display body device.

In the display apparatus according to the embodiment of the present disclosure, the irregular structure is provided on the front surface of the display body device including the plurality of pixels each of which includes the plurality of light-emitting elements as light source elements. This makes it possible to reduce reflection of external light.

Effects of the Invention

According to the display apparatus of the embodiment of the present disclosure, the irregular structure is provided on the front surface of the display body device including the plurality of light-emitting elements as light source elements; therefore, reflection of external light is reduced. This makes it possible to improve viewability.

It is to be noted that effects described here are not necessarily limitative, and may be any of effects described in the present disclosure.

BRIEF DESCRIPTION OF DRAWINGS

FIG. 1 is a cross-sectional view of an example of a display body device included in a display apparatus according to a first embodiment of the present disclosure.

FIG. 2 is a schematic plan view of a configuration of a pixel of the display body device illustrated in FIG. 1.

FIG. 3 is a diagram for describing a surface roughness parameter (Rsm).

FIG. 4 is a diagram for describing a surface roughness parameter (Rz).

FIG. 5 is a perspective view of a configuration of the display apparatus including the display body device illustrated in FIG. 1.

FIG. 6 is a perspective view of a configuration of a mounting substrate illustrated in FIG. 5.

FIG. 7 is a perspective view of a configuration of a unit substrate illustrated in FIG. 6.

FIG. 8 is a diagram illustrating an example of a circuit configuration of the display body device illustrated in FIG. 1.

FIG. 9 is a diagram illustrating an example of a planar configuration of a light-emitting element illustrated in FIG. 8.

FIG. 10 is a diagram illustrating an example of a planar configuration of a drive IC illustrated in FIG. 8.

FIG. 11 is a cross-sectional view of an example of a display body device included in a display apparatus according to a second embodiment of the present disclosure.

FIG. 12 is a characteristic diagram showing surface irregularity data of a given optical film.

FIG. 13 is a diagram illustrating a tilt angle in one area (Axy) in a case where the surface irregularity data illustrated in FIG. 12 is divided into areas.

FIG. 14 is a characteristic diagram illustrating a tilt angle distribution in a given optical film.

MODES FOR CARRYING OUT THE INVENTION

Some embodiments of the present disclosure will be described below in detail with reference to the drawings. The following description is given of specific examples of the present disclosure, and the present disclosure is not limited to the following embodiments. Description is given in the following order.

1. First Embodiment (an example of a display body device having a surface provided with irregular structures)
   1-1. Configuration of Display Body Device
   1-2. Method of Forming Resin Layer Having Irregular Structures
   1-3. Configuration of Display Apparatus
   1-4. Workings and Effects
2. Second Embodiment (an example in which a tilt angle distribution of a plurality of projections included in the irregular structures is controlled)
   2-1. Configuration of Optical Film
   2-2. Workings and Effects
3. Examples

1. First Embodiment

FIG. 1 illustrates a cross-sectional configuration of a display body device (display body device 10E) according to a first embodiment of the present disclosure. The display body device 10E is used, for example, as a cell included in a so-called tiling display (display apparatus 1; see FIG. 5). As illustrated in FIG. 1, the display body device 10E according to the present embodiment has a configuration in which an optical film 46 having a plurality of projections 46X as irregular structures is bonded to a front surface side (side of a surface S1) of a wiring substrate 30 on which pixels 11 having a plurality of light-emitting elements (e.g., light-emitting elements 12R, 12G, and 12B) as light source elements 12 are arranged. It is to be noted that although FIG. 1 illustrates an example in which one pixel 11 is provided for the sake of simplification of the drawing, actually, for example, a plurality of pixels 11 are arranged in a matrix, for example, as illustrated in FIG. 2.

(1-1. Configuration of Display Body Device)

The display body device 10E includes the wiring substrate 30, a fine L/S layer 40, and the plurality of pixels 11. The wiring substrate 30 includes a plurality of wiring lines provided over a plurality of layers on a front surface and a back surface. The fine L/S layer 40 is formed in contact with the front surface (the surface S1) of the wiring substrate 30. The plurality of pixels 11 is arranged on the fine L/S layer 40 in a matrix, for example, as illustrated in FIG. 2. Each of the pixels 11 includes the light source element 12 and a drive IC 13 that drives the light source element 12. The light source element 12 corresponds to a specific example of a "light source element" of the present disclosure. The wiring substrate 30 further includes, for example, a sealing layer 43 that covers the front surface including the pixels 11, and a light-blocking layer 44 in this order. In the present embodiment, as described above, an optical film 46 having the plurality of projections 46X on a front surface is stacked on the light-blocking layer 44 with, for example, a pressure-sensitive adhesive layer 45 interposed therebetween. For example, an antireflection film 47 is provided on the front surface of the optical film 46.

The wiring substrate 30 is, for example, a laminated substrate in which layers are electrically coupled to each other through a via. As described above, for example, the pixels 11 each including the light source element 12 and the drive IC 13 are provided on the front surface (the surface S1) of the wiring substrate 30. Although not illustrated, for example, a plurality of electrode pads and the like are provided as external terminals on the back surface (surface S2) of the wiring substrate 30. For example, one or more electrode pads are provided for each of a data line SigR1, a data line SigG1, a data line SigB1, a gate line Gate1, a gate line Gate2, a light source line VDD1, a reference voltage line Ref1, a reference voltage line Ref2, and a saw-tooth voltage line Saw that are to be described later.

The wiring substrate 30 is, for example, a build-up substrate, and includes a core substrate 31, a buildup layer 32, and a buildup layer 33. The buildup layer 32 is formed in contact with a front surface (on side of the surface S1) of the core substrate 31, and the buildup layer 33 is formed in contact with a back surface (on side of the surface S2) of the core substrate 31.

The core substrate 31 secures stiffness of the display body device 10E, and is, for example, a glass epoxy substrate. The buildup layer 32 includes one or more wiring layers. The buildup layer 32 includes, for example, a wiring layer 32A, an insulating layer 32B, a wiring layer 32C, an insulating layer 32D, and a wiring layer 32E in this order from a top surface of the core substrate 31, as illustrated in FIG. 1. The buildup layer 33 includes one or more wiring layers. The buildup layer 33 includes, for example, a wiring layer 33A, an insulating layer 33B, a wiring layer 33C, an insulating layer 33D, and a wiring layer 33E in this order from a back surface of the core substrate 31, as illustrated in FIG. 1. The wiring layers 32A, 32C, 32E, 33A, 33C, and 33E include, for example, copper. The insulating layers 32B, 32D, 33B, and 33D include, for example, a ultraviolet-curing resin or a thermosetting resin.

The fine L/S layer 40 includes a wiring layer 42 and an insulating layer 41 that is provided between the wiring layer 42 and the top surface of the wiring substrate 30. The insulating layer 41 is in contact with the wiring layers 42 and the top surface of the wiring substrate 30. The wiring layer 42 is a layer including a wiring line 14, and the wiring line 14 is, for example, a wiring line that electrically couple the light source element 12 and the drive IC 13 to each other in the pixel 11. The insulating layer 41 includes, for example, VPA. VPA is commonly used as a resist, and, for example, VPA manufactured by Nippon Steel Chemical Co., Ltd. is marketed. The wiring layer 42 (and the wiring line 14) includes, for example, copper, and is formed by, for example, sputtering. The wiring layer 42 including the wiring line 14 includes, for example, a plating layer on a front surface.

The light source elements 12 are, for example, chip-like components that emit light of a plurality of colors (here, three colors (R, G, B)), and one of the light source elements 12 is provided for each of the pixels 11, for example, as illustrated in FIG. 2. In a case where the number of emission colors of the light source elements 12 is three (R, G, and B), the light source elements 12 each include, for example, the light-emitting element 12R that emits red light, the light-emitting element 12G that emits green light, and the light-emitting element 12B that emits blue light. The light-emitting element 12R, 12G, and 12B are covered with a protector 12$i$ (see FIG. 9) including, for example, a resin or the like. The emission colors of the light source elements 12 are not limited to three colors (R, G, and B), and may be four or more colors (R, G, B, and W).

The light-emitting elements 12R, 12G, and 12B are, for example, LED chips. Here, the LED chips each has a chip size of the order of micrometers, and has, for example, several tens of μm square. The LED chip includes, for example, a semiconductor layer and two electrodes.

The semiconductor layer includes a stacked structure in which an active layer is sandwiched between semiconductor layers of different electrical conductivity types. The two electrodes are disposed on a plane common to (same as) the semiconductor layer. The light-emitting elements 12R, 12G, and 12B may be chips separated from each other, or may be included in a single chip common to each other.

The pixel 11 of the present embodiment and the light-emitting elements 12R, 12G, 12B included in the light source element 12 disposed in the pixel 11 are preferably configured such that a value (D/P) obtained by dividing a light emission area (D) of each of the light-emitting elements 12R, 12G, and 12B by an area (P) of the pixel 11 is 0.04 or less, as expressed by the following equation (3). The light emission area (D) of each of the light-emitting elements 12 R, 12G, and 12B is calculated by the following equation (1). The area (P) of the pixel 11 is calculated by the following equation (2). In the equation (1), dx is a length of one side (e.g., a short side) of each of the light-emitting elements (the light-emitting element 12B in FIG. 2), and dy is a length of another side (e.g., a long side) intersecting the one side of each of the light-emitting elements (the light-emitting element 12B in FIG. 2). In the equation (2), px is, for example, a length of one side (e.g., a short side, in a row direction (X-axis direction) in FIG. 2) of each of the pixels 11 arranged in a matrix, and py is a length of another side (e.g., a long side, in a column direction (Y-axis direction) in FIG. 2) intersecting the one side of each of the pixels 11.

[Math 1]

$$D = dx \times dy \quad (1)$$

(dx: a length of a short side of a light-emitting element, dy: a length of a long side of the light-emitting element)

$$P = px \times py \quad (2)$$

(px: a length of a short side of a pixel, py: a length of a long side of the pixel)

$$D/\leq 004 \quad (3)$$

The value (D/P) obtained by dividing the light emission area (D) by the area (P) of the pixel 11 is preferably 0.04 or less, more preferably 0.01 or less, and even more preferably 0.001 or less, as expressed by the equation (3) described above. Thus, the display apparatus 1 having higher definition is achieved.

The sealing layer 43 includes, for example, a light transmissive resin layer that allows visible light to pass therethrough. The light-blocking layer 44 has openings 44H at positions opposed to the respective light source elements 12. Light emitted from the light source elements 12 is outputted to outside through the respective openings 44H. The light-blocking layer 44 includes a material that absorbs visible light.

The pressure-sensitive adhesive layer 45 bonds the wiring substrate 30 and the optical film 46 together. The pressure-sensitive adhesive layer 45 includes, for example, a transparent optical pressure-sensitive adhesive film (optical clear adhesive film: OCA film) or the like. Materials of the pressure-sensitive adhesive layer 45 include, but are not limited to, acrylic-based, epoxy-based, or silicone-based adhesives and pressure-sensitive adhesives.

The optical film 46 scatters reflected light on a front surface of the display body device 10E, and has, for example, a configuration in which a resin layer 46B having a plurality of projections 46X is stacked on a base 46A.

The base 46A includes a light-transmissive material that allows visible light to pass therethrough, such as a cyclic olefin film (cyclic olefin copolymer: COC film). Materials of the base 46A include, but are not limited to, inorganic materials such as glass, polymeric materials such as polyethylene terephthalate, polycarbonate, polyimide, polyethersulfone, polyarylate, polyolefin, acrylics, cycloolefin polymers, and cycloolefin copolymers. In addition, the base 46A may include various additives such as a photostabilizer, a ultraviolet light absorber, an antistatic agent, a flame retardant, and an antioxidant as necessary.

The resin layer 46B has the plurality of projections 46X formed on a front surface, for example, by adding microparticles to a light-transmissive resin material that allows visible light to pass therethrough, and coating the base 56A with the resin material, as will be described in detail later.

Surface roughness of an irregular structure on the front surface of the optical film 46 of the present embodiment preferably satisfies the following equations (4) and (5).

[Math. 2]

$$0.1 \leq Rz/RSm \leq 2 \quad (4)$$

(Rz: a maximum cross-section height, RSm: an element mean length)

$$RSm \leq (dx+dy)/2 \quad (5)$$

Rsm is a mean length (element mean length) of a roughness profile element. As illustrated in FIG. 3, Rsm is a mean value in a case where lengths of profile elements of respective irregular structures in a sampling length (l) are Xs1, Xs2, ..., and Xsm, and is calculated by the following equation (6).

[Math. 3]

$$RSm = \frac{1}{m} \sum_{i=1}^{m} Xsi \quad (6)$$

Rz is a maximum height roughness (maximum cross-section height), and is the sum of a maximum profile peak height Rp and a maximum profile valley depth Rv of each of irregular structures in the sampling length (l), as illustrated in FIG. 4 and the following equation (7).

[Math. 4]

$$Rz = Rp + Rv \quad (7)$$

In the equation (4) described above, in a case where Rz/RSm is smaller than 0.1, reflection becomes conspicuous. In a case where Rz/RSm is larger than 2, transmittance of the optical film 46 may be impaired to cause deterioration in image quality. In addition, total light transmittance of the optical film 46 alone is desirably 85% or more, and diffuse transmittance/the total light transmittance is preferably 45% or more and 95% or less. This makes it possible to reduce reflection. In a case where the diffuse transmittance/the total light transmittance is less than 45%, reflection from an oblique direction becomes conspicuous.

It is to be noted that the antireflection film 47 is preferably provided on the optical film 46, as illustrated in FIG. 1. In addition, an antifouling coat, an anti-fingerprint coat, a coat having improved slipperiness, and the like may be stacked as appropriate.

(1-2. Method of Forming Resin Layer Having Irregular Structures)

It is possible to form the resin layer 46B that has irregular structures (projections 46X) on a front surface and is included in the optical film 46 by the following methods, for example.

It is possible to form the resin layer 46B, for example, by applying a resin coating agent containing microparticles to the base 46A (a filler coating method). Examples of the microparticles include, but are not limited to, organic microparticles such as acrylics and styrene, and metal oxide-based microparticles such as silica, alumina, and titania. As the resin coating agent, in addition to the microparticles, various oligomer/monomer resins, photopolymerization initiators, cross-linking agents, leveling materials, surfactants, antifoaming agents, antistatic agents, and various solvents are contained, and it is possible to add these resin coating agents, as necessary.

In addition, it is possible to form the resin layer 46B on the front surface of the base 46A by using a phase separation phenomenon caused in a case where a polymer solution containing a plurality of resins is applied and dried (a phase separation coating method).

Further, it is possible to form the resin layer 46B by contact-transferring a separately fabricated mold onto a resin or the base 46A and curing the resin or the base 46A with heat or ultraviolet rays (a shape coating method).

Furthermore, it is possible to form the resin layer 46B on the base 46A by spraying and blasting particles onto the base 46A (a blasting method).

In addition, in a case where the base 46A is molded, it is possible to form the resin layer 46B collectively with the base 46A by performing melt extrusion or the like in a state in which microparticles are contained in a raw material of the base 46A (a kneading method).

It is to be noted that the pressure-sensitive adhesive layer 45 is formed on the back surface of the optical film 46 (specifically, the base 46A) as necessary, and the optical film 46 is bonded to the sealing layer 43 and the light-blocking layer 44 with the pressure-sensitive adhesive layer 45 interposed therebetween. The pressure-sensitive adhesive layer 45 is formed, for example, by applying a liquid resin to the back surface of the base 46A, bonding the base 46A to the light-blocking layer 44, and then curing the liquid resin with room temperature, heat, ultraviolet rays, or the like.

In addition, a primer layer may be provided on the base 46A as necessary. As the primer layer, for example, an organic layer containing a resin or the like as a main component, or an inorganic layer containing a metal or a metal compound as a main component is usable. Further, surface treatment may be subjected to the base as necessary. Examples of the surface treatment include, but are not limited to, corona treatment, plasma treatment, flame treatment, and cleaning treatment.

(1-3. Configuration of Display Apparatus)

FIG. 5 illustrates an entire configuration of the display apparatus 1 using the display body device 10E. For example, as illustrated in FIG. 5, the display apparatus 1 includes a display panel 10 and a control circuit 20 that controls the display panel 10 (specifically, the display body device 10E).

The display panel 10 includes a mounting substrate 10A and a counter substrate 10B that are superimposed on each other. The counter substrate 10B has a front surface serving as an image display surface, and has a display region in a central portion, and a frame region around the display region. The frame region is a non-display region. The counter substrate 10B is disposed, for example, at a position opposed to the mounting substrate 10A with a predetermined gap interposed therebetween. The counter substrate 10B may be in contact with a top surface of the mounting substrate 10A.

FIG. 6 illustrates an example of a configuration of the mounting substrate 10A. For example, as illustrated in FIG. 6, the mounting substrate 10A includes a plurality of unit substrates 10C arranged in a tiled fashion. FIG. 7 illustrates an example of a configuration of the unit substrate 10C. The unit substrate 10C includes, for example, a plurality of display body devices 10E arranged in a tiled fashion, and a supporting substrate 10D that supports the respective display body devices 10E. The unit substrate 10C further includes a control substrate (not illustrated). The control substrate is electrically coupled to the respective display body devices 10E through respective electrode pads 34 to be described later, for example. The supporting substrate 10D includes, for example, a metallic frame (metal plate), a wiring substrate, or the like. In a case where the supporting substrate 10D includes the wiring substrate, it is possible for the supporting substrate 10D to also serve as a control substrate. At this time, at least one of the supporting substrate 10D or the control substrate is electrically coupled to the display body devices 10E.

FIG. 8 illustrates an example of a circuit configuration of the display body device 10E. The display body device 10E includes a plurality of signal lines (data lines Sig) extending in the column direction and a plurality of selection lines (gate lines Gate) extending in the row direction in a region opposed to the display region. The data lines Sig and the gate lines Gate include, for example, copper.

The display body device 10E further includes, for example, a plurality of saw-tooth voltage lines Saw, a plurality of light source lines VDD1 and a plurality of light source lines VDD2, a plurality of reference voltage lines Ref1 and a plurality of reference voltage lines Ref2, and a plurality of ground lines GND in the region opposed to the displaying region. The saw-tooth voltage lines Saw extend, for example, in the row direction. Each of the light source lines VDD1, each of the light source lines VDD2, each of the reference voltage lines Ref1, each of the reference voltage lines Ref2, and each of the ground lines GND extend, for example, in the column direction. At least one of the saw-tooth voltage lines Saw, the light source lines VDD1, the light source lines VDD2, the reference voltage lines Ref1, the reference voltage lines Ref2, or the ground lines GND may be omitted depending on a driving system. The saw-tooth voltage lines Saw, the light source lines VDD1, the light source lines VDD2, the reference voltage lines Ref1, the reference voltage lines Ref2, and the ground lines GND include, for example, copper. It is to be noted that the data lines Sig, the light source lines VDD1, the light source lines VDD2, the reference voltage lines Ref1, the reference voltage lines Ref2, and the ground lines GND are hereinafter collectively referred to as "column wiring lines". In addition, the gate lines Gate and the saw-tooth voltage lines Saw are hereinafter collectively referred to as "row wiring lines".

The data lines Sig are wiring lines to which a signal corresponding to an image signal is inputted by the control circuit 20. The signal corresponding to the image signal controls, for example, the light emission luminance of the light source element 12. The plurality of data lines Sig includes, for example, wiring lines of types corresponding to the number of emission colors of the light source element 12. In a case where the light source element 12 has, for example, three emission colors (the light-emitting elements 12R, 12G, and 12B) as described above, the plurality of data lines Sig include, for example, a plurality of data lines SigR, a plurality of data lines SigG, and a plurality of data lines SigB. Each of the data lines SigR is a wiring line to which a signal corresponding to a red image signal is inputted by the control circuit 20. Each of the data lines SigG is a wiring line to which a signal corresponding to a green image signal is inputted by the control circuit 20. Each of the data lines SigB is a wiring line to which a signal corresponding to a blue image signal is inputted by the control circuit 20. Each of the data lines Sig, each of the gate lines Gate, each of the light source lines VDD2, and each of the ground lines GND are formed in, for example, the buildup layers 32 and 33 described above, and the like.

In a case where the plurality of data lines Sig includes the plurality of data lines SigR, the plurality of data lines SigG, and the plurality of data lines SigB, a set of data lines Sig including one data line SigR, one data line SigG, and one data line SigB is assigned to each pixel column, for example. Depending on the driving system, the set of data lines Sig is assigned to every two or more pixel columns. In addition, depending on the driving system, the set of data lines Sig described above may be replaced by a single data line Sig.

Each of the gate lines Gate is a wiring line to which a signal for selecting the light source element 12 is inputted by the control circuit 20. The signal for selecting the light source element 12 is, for example, a signal for starting sampling of a signal inputted to the data line Sig and inputting the sampled signal to the light source element 12 to start light emission of the light source element 12. One gate line Gate is assigned to each pixel row, for example. Each of the saw-tooth voltage lines Saw is, for example, a wiring line to which a signal having a saw-tooth waveform is inputted by the control circuit 20. The signal having the sawtooth waveform is compared to the sampled signal, and, for example, the sampled signal is inputted to the light source element 12 only in a period in which a peak value of the signal having the sawtooth waveform is higher than a peak value of the sampled signal. One saw-tooth voltage line Saw is assigned to every two pixel rows, for example. Each of the light source lines VDD2 is a wiring line to which a drive current supplied to the light source element 12 is inputted by the control circuit 20. One light source line VDD2 is assigned to every two pixel columns, for example. Each of the light source lines VDD1, each of the reference voltage lines Ref1, each of the reference voltage lines Ref2, and each of the ground lines GND are wiring lines to which a fixed voltage is inputted by the control circuit 20. A ground potential is inputted to each of the ground lines GND. One light source line VDD1 is assigned to every two pixel columns, for example. One reference voltage line Ref1 is assigned to every two pixel columns, for example. One reference voltage line Ref2 is assigned to every two pixel columns, for example. One ground line GND is assigned to every two pixel columns, for example.

FIG. 9 illustrates an example of a planar configuration of the light source element 12. A symbol enclosed by a square in FIG. 9 indicates that a terminal adjacent to the symbol is electrically coupled to a terminal adjacent to the same symbol illustrated in FIG. 10 to be described later. The light source element 12 is a chip-like component that emits light of a plurality of colors. In the present embodiment, the light source element 12 includes, for example, the light-emitting element 12R that emits red light, the light-emitting element 12G that emits green light, and the light-emitting element 12B that emits blue light, as described above.

The light source element 12 includes, for example, six electrode pads 12a to 12f. In the light-emitting element 12G, one electrode is electrically coupled to an electrode pad 13m of the drive IC 13 through the electrode pad 12a and the wiring line 14, and another electrode is electrically coupled to the ground line GND through the electrode pad 12b and the wiring line 14. In the light-emitting element 12R, one electrode is electrically coupled to an electrode pad 13o of the drive IC 13 through the electrode pad 12c and the wiring line 14, and another electrode is electrically coupled to the ground line GND through the electrode pad 12d and the wiring line 14. In the light-emitting element 12B, one electrode is electrically coupled to an electrode pad 13p of the drive IC 13 through the electrode pad 12e and the wiring line 14, and another electrode is electrically coupled to the ground line GND through the electrode pad 12f and the wiring line 14.

As described above, the wiring line 14 is a wiring line that electrically couples the light source element 12 and the drive IC 13 to each other in the pixel 11. Further, the wiring line 14 is, for example, a wiring line that electrically couples the pixel 11 and the data line Sig, the gate line Gate, the light source line VDD1, the light source line VDD2, the reference voltage line Ref1, the reference voltage line Ref2, the saw-tooth voltage line Saw, or the ground line GND to each other. The wiring line 14 is formed by sputtering or plating, for example.

FIG. 10 illustrates an example of a planar configuration of the drive IC 13. A wiring line name enclosed by a square in FIG. 10 indicates a name of a wiring line electrically coupled to a terminal adjacent to the wiring line name. The drive IC 13 controls light emission of the light source element 12, and includes, for example, fourteen electrode pads 13a, 13b, 13c, 13d, 13e, 13f, 13g, 13h, 13i, 13k, 13m, 13n, 13o, and 13p.

The electrode pads 13a, 13b, and 13c are electrically coupled to the data lines SigG, SigR, and SigB through the wiring line 14. The electrode pads 13d and 13e are electrically coupled to the light source lines VDD1 and VDD2 through the wiring line 14. The electrode pads 13f and 13g are electrically coupled to the reference voltage lines Ref1 and Ref2 through the wiring line 14. The electrode pad 13h is electrically coupled to the ground line GND through the wiring line 14. The electrode pad 13i is electrically coupled to the gate line Gate through the wiring line 14. The electrode pad 13k is electrically coupled to the saw-tooth voltage line Saw through the wiring line 14. The electrode pads 13m, 13o, and 13n are electrically coupled to the electrode pads 12a, 12c, and 12e of the light source element 12 through the wiring line 14. The electrode pad 13p is not coupled to the wiring line 14.

(1-4. Workings and Effects)

As described above, image quality of the display apparatus is improved by using a technique of giving an antireflection function and a technique of scattering reflected light in order to reduce reflection by external light.

The antireflection function is realized by using, for example, an antireflection film. The antireflection film is manufactured by a dry system in which thin films including metal oxides and metal nitrides having a low refractive index and a high refractive index are stacked using a method such as sputtering, CVD (chemical vapor deposition), and evaporation. In addition to the dry method described above, it is also possible to manufacture the antireflection film by using a wet system in which materials including organic materials having a low refractive index and a high refractive index as bases are applied onto a workpiece. The antireflection film manufactured by any of the methods uses a thin film interference effect, and thereby has incident angle dependence, which causes an issue that reflection from an oblique direction becomes large.

The technique of scattering reflected light is realized by using an antiglare film or a mat film. The antiglare film and the mat film have irregularities formed on surfaces to scatter reflected light, thereby reducing reflection, and it is expectable that the antiglare film and the mat film have a certain effect also on oblique light, as compared with the antireflection film.

Incidentally, in recent years, definition of display apparatuses becomes higher, and pixels become smaller, with which, for example, phenomena called color breakup, glare, and sparkling have been confirmed. Specifically, in the phenomena, a screen is flickering. The reason for this is that sizes of irregularities formed on the surface of the antiglare film or the like are larger than a pixel size, which causes the irregularities on the surface to act as lenses, thereby causing variations in luminance in each of three colors (R, G, and B) of pixels. Color breakup, glare, and sparkling causes a decrease in viewability; therefore, an improvement in viewability is desired.

In contrast, in the display apparatus 1 according to the present embodiment, the optical film 46 having irregular structures (the plurality of projections 46X) is provided on the surface of the display body device 10E. This makes it possible to reduce reflection of external light.

As described above, in the present embodiment, the optical film 46 having irregular structures (the plurality of projections 46X) is provided on the surface of the display body device 10E, which makes it possible to reduce reflection of external light and improve viewability.

The light emission area (D) of each of the plurality of light-emitting elements 12R, 12G, and 12B and the area (P) of the pixel 11 are respectively calculated by the equations (1) and (2) described above. In the present embodiment, the plurality of pixels 11 arranged in a matrix, and the plurality of light-emitting elements 12R, 12G, and 12B included in the light source element 12 provided in each of the pixels 11 satisfy the equation (3) described above. Specifically, for example, a value obtained by dividing the light emission area (D) of each light-emitting element (e.g., the light-emitting element 12R) by the area (P) of each of the pixels 11 satisfies the equation (3) described above. This makes it possible to further reduce reflection of external light and further improve viewability.

Further, in the present embodiment, surface roughness of the irregular structures provided on the surface satisfies the equations (4) and (5) described above. This makes it possible to reduce reflection of external light even in, for example, micro-LED displays having finer pixels among display apparatuses having higher definition, and to reduce generation of color breakup and the like.

A second embodiment of the present disclosure will be described below. Same components as those of the foregoing first embodiment are denoted by same reference numerals and description thereof is omitted.

2. Second Embodiment

FIG. 11 illustrates a cross-sectional configuration of a display body device (display body device 50E) according to the second embodiment of the present disclosure. The display body device 50E is used, for example, as a cell included in a so-called tiling display (e.g., the display apparatus 1) similarly to the first embodiment. As illustrated in FIG. 11, the display body device 50E has a configuration in which an optical film 56 having a plurality of projections 56X as irregular structures is bonded to the front surface side (side of the surface S1) of the wiring substrate 30 of the wiring substrate on which the pixels 11 having a plurality of light-emitting elements (e.g., the light-emitting elements 12R, 12G, and 12B) are arranged as the light source element 12. In the present embodiment, a tilt angle distribution in a plane (in an X-Y plane) is controlled to cause a percentage of certain angle components within the plurality of projections 56X to be within a predetermined range. It is to be noted that although FIG. 11 illustrates an example in which one pixel 11 is provided for the sake of simplification of the drawing, actually, as in the display body device 10E according to the first embodiment, for example, a plurality of pixels 11 are arranged in a matrix, for example, as illustrated in FIG. 2.

(2-1. Configuration of Optical Film)

The display body device 50E includes the wiring substrate 30, the fine L/S layer 40, and the plurality of pixels 11. The wiring substrate 30 includes a plurality of wiring lines provided over a plurality of layers on the front surface and the back surface. The fine L/S layer 40 is formed in contact with the front surface (the surface S1) of the wiring substrate 30. The plurality of pixels 11 is arranged on the fine L/S layer 40 in a matrix, for example, as illustrated in FIG. 2. Each of the pixels 11 includes the light source element 12 and the drive IC 13 that drives the light source element 12. The light source element 12 corresponds to a specific example of a "light source element" of the present disclosure. The wiring substrate 30 further includes, for example, the sealing layer 43 that covers the front surface including the pixels 11, and the light-blocking layer 44 in this order. In the present embodiment, as described above, an optical film 56 having the plurality of projections 56X on a front surface is stacked on the light-blocking layer 44 with, for example, the pressure-sensitive adhesive layer 45 interposed therebetween. For example, the antireflection film 47 is provided on the front surface of the optical film 56.

The optical film 56 scatters reflected light on a front surface of the display body device 50E, and has, for example, a configuration in which a resin layer 56B having a plurality of projections 56X is stacked on a base 56A. A tilt angle distribution in the plane (in the X-Y plane) of the plurality of projections 56X is controlled to cause a percentage of a certain angle component to be within a predetermined range.

The base 56A includes a light-transmissive material that allows visible light to pass therethrough, such as a COC film. Materials for the base 56A include, but are not limited to, inorganic materials such as glass, polymeric materials such as polyethylene terephthalate, polycarbonates, polyimide, polyethersulfone, polyarylate, polyolefin, acrylics, cycloolefin polymers, and cycloolefin copolymers. In addition, the base 56A may include various additives such as a photostabilizer, an ultraviolet light absorber, an antistatic agent, a flame retardant, and an antioxidant as necessary.

The resin layer 56B is provided on a front surface of the base 56A and has a plurality of projection 56X formed on a front surface. The resin layer 56B includes irregular structures on the front surface of the optical film 56.

In the irregular structures on the front surface of the optical film 56 according to the present embodiment, tilt angles of the plurality of projections 56X on the front surface (the X-Y plane) of the display body device 50E are preferably distributed in the following range. First, a component (hereinafter, referred to as an angle component) having a tilt angle of 30° or more preferably accounts for less than 33% of the plurality of projections 56X in the X-Y plane of the display body device 50E. In addition, an angle component having an angle of 2° or less preferably accounts for less than 6.6% of the plurality of projections 56X in the X-Y plane of the display body device 50E.

In the present embodiment, the tilt angle and the tilt angle distribution are defined as follows. First, surface irregularities of a given optical film in, for example a 251.39 μm×188.70 μm region are measured in a three-dimensional optical interferometric surface profile measuring device (Vertscan) to obtain parameters of respective irregularities (FIG. 12). Next, the surface irregularity data is divided into areas having a division size of 640×480. A mean angle with respect to the xy-plane in one area unit (for example, an area Axy) is defined as the above-described tilt angle (FIG. 13). The tilt angle distribution indicates that the tilt angles in all the area units are determined and how many percentage (%) of the tilt angle in each of the area units is in the entire area, and an example of the tilt angle distribution is a characteristic diagram in FIG. 14.

In the optical film 56 according to the present embodiment, a percentage of a component (high angle component) having a high tilt angle of 30° or more is set to less than 33% of all the projections 56X provided on the front surface of the display body device 50E, which causes external light incoming from various directions to be reflected by the front surface of the optical film 56. In addition, a percentage of a component (low angle components) having a low tilt angle of 2° or less is set to less than 6.6% of all the projections 56X provided on the front surface of the display body device 50E, which causes a percentage of regularly reflected light from a specific object to an observer to be reduced.

It is possible to form the resin layer 56B by using the filler coating method, the phase separation coating method, the shape coating method, the blasting method, and the kneading method, for example, similarly to the resin layer 46B. Specifically, using the filler coating method and the phase separation coating method makes it possible to control an irregularity pitch of the resin layer 56B with high accuracy.

(2-2. Workings and Effects)

In order to improve viewability, indices include "black floating" caused by visually recognizing diffused light of external light, and "reflection properties" in which an outline of an object reflected on a display is clearly reflected to increase viewability, in addition to the above-described indices such as color breakup, glare, and sparring.

In PTL 1 described above, and the like, an average tilt angle or the like of an irregularity of an antiglare film used for a surface of a display is defined, and a shape of the irregularity on the surface is defined by parameters such as an average interval of the irregularity, Ra, and Rz in addition to the average tilt angle. However, these parameters are for a filler-type antiglare film used in an LCD, and the defined size of the irregularity is as large as 50 μm or more, and it is difficult to obtain expected effects even if these parameter are simply applied to the display apparatus 1 (the display body devices 10E and 50E) of the present disclosure.

In contrast, in the display body device 50E according to the present embodiment and the display apparatus 1 including the display body device 50E, the plurality of projections 56X included in the irregular structures of the optical film 56 has the above-described tilt angle distribution on the front surface of the display body device 50E. For example, the angle component having an angle of 30° or more accounts for less than 33% of the plurality of projections 56X in the X-Y plane of the display body device 50E. This makes it possible to reflect external light incoming from various directions by the front surface of the optical film 56. In addition, the angle component having an angle of 2° or less accounts for less than 6.6% of all the plurality of projections 56X in the X-Y plane of the display body device 50E. This makes it possible to reduce the percentage of regularly reflected light from the specific object to the observer.

As described above, in the present embodiment, for example, the plurality of projection 56X included in the irregular structures of the optical film 56 are configured to cause the angle component having an angle of 30° or more to account for less than 33% of the plurality of projections 56X in the X-Y plane of the display body device 50E. This makes it possible to reflect external light incoming from various directions by the front surface of the optical film 56, and reduce the black floating. In addition, the angle component having an angle of 2° or less is caused to account for less than 6.6% of all of the plurality of projections 56X in the X-Y plane of the display body device 50E, which makes it possible to reduce the percentage of regularly reflected light from the specific object to the observer and reduce the reflection properties. Accordingly, it is possible to improve viewability.

It is to be noted that in the present embodiment, the tilt angle distribution of the plurality of projections 56X included in the irregular structures of the optical film 56 is set such that the angle component having an angle of 30° or more accounts for less than 33% and the angle component having an angle of 2° or less accounts for less than 6.6% of all of the projections 56X, which makes it possible to reduce both black floating and the reflection properties, and further improve viewability.

Further, in the display body device 50E according to the present embodiment and the display apparatus 1 including the display body device 50E, the tilt angle distribution of the plurality of projections 56X included in the irregular structure of the optical film 56 satisfies that the angle component having an angle of 30° or more accounts for less than 33% and the angle components having an angle of 2° or less accounts for less than 6.6% of all of the plurality of projections 56X, and as described in the first embodiment, the plurality of pixels 11 arranged in a matrix, and the plurality of light-emitting elements 12R, 12G, and 12B included in the light source element 12 provided in each of the pixels 11 satisfy the above equations (1), (2), and (3), and further, surface roughness of the irregular structures of the optical film 56 satisfies the above equations (4) and (5), which makes it possible to further improve visibility.

3. Examples

Next, examples of the present disclosure will be described in detail.

Experiment 1

(Fabrication of Samples)

First, the display body device 10E was prepared in which, the light source elements 12 having three kinds of light-emitting diodes having a mean length of 25 μm as the light-emitting elements 12R, 12G, and 12B were arranged at pitches of 1.26 mm. The optical film 46 having irregular structures (the plurality of projection 46X) on the front surface was bonded onto the display body device 10E (specifically, onto the light-blocking layer 44) to fabricate samples (samples 1 to 6) for evaluation, and color breakup, haze, total light transmittance, and regular reflectance of the samples were measured. The resin layer 46B included in the optical film 46 was roughened by using a coating agent containing a filler. The surface roughness of the resin layer 46B was measured by a laser microscope VK-5000 manufactured by Keyence Corporation. The color breakup, the haze, the total light transmittance, and the regular reflectance were measured with use of the following methods.

(Color Breakup Evaluation Method)

Shooting by a camera was performed while the display body device 10E to which the optical film 46 was bonded was turned on to capture image data. An image was obtained by subjecting the image data to fast Fourier transform and removing a frequency derived from a pitch of the pixels, and the image was subjected to inverse Fourier transform. Standard deviation of a luminance distribution (luminance variation) was calculated from the image data thus obtained, and the standard deviation was used as an evaluation index. An allowable standard deviation values for color breakup is 5.0 or less, preferably 3.0 or less, more preferably 2.0 or less.

(Method of Measuring Total Light Transmittance and Haze)

Total light transmittance and haze were measured with use of a Haze-Transmittance meter HM-150 manufactured by Murakami Color Research Laboratory. It is to be noted that each of the samples 1 to 6 was measured as a single film; therefore, it was assumed that a loss due to reflection on a back surface was included.

(Method for Measuring Regular Reflectance)

Regular reflectance was measured by a spectrophotometer V-550 manufactured by JASCO Corporation. As a comparison of reflection, regular reflectance at an oblique angle of 60° C. was described. It is to be noted that a reflectance value varies depending on, for example, whether an antireflection film is stacked on irregularities on an outermost surface.

In the following, configurations of the optical films 46 used as experimental examples 1 to 6, and results of color breakup, haze, total light transmittance, and regular reflectance are described. In addition, Table 1 summarizes these results.

Experimental Example 1

As the base 46A of the optical film 46, a PET film having a film thickness of 100 μm was used. In order to form irregularities on the front surface of the resin layer 46B, 10% by weight of a urethane acrylate oligomer, 20% by weight of an acrylate monomer, 2% by weight of an acrylic filler (φ5 μm), 5% by weight of a photopolymerization initiator, and 63% by weight of butyl acetate were mixed and stirred to obtain a coating agent. The coating agent thus obtained was applied onto a base by a die coater, dried at 120° C. for 5 minutes, and then cured by ultraviolet radiation to obtain the optical film 46 (the sample 1) having irregularities on the front surface.

The element mean length (Rsm) of irregular structures on the front surface of the sample 1 was 6.2 μm, and the largest cross-section height (Rz) was 2.1 μm. In addition, in a case where the sample 1 was evaluated using the above measuring methods, total light transmittance was 95.0%, haze was 50.1%, and a color breakup index (standard deviation) was 4.2. The sample 1 had no visible color breakup and a regular reflectance at 60° of 0.93%.

Experimental Example 2

The optical film 46 (the sample 2) having irregularities on the front surface was obtained in a similar manner to that in the experimental example 1 except that the acrylic filler was increased to 3% by weight.

The element mean length (Rsm) of irregular structures on the front surface of the sample 2 was 6.8 μm, and the maximum cross-section height (Rz) was 3.3 μm. In addition, in a case where the sample 2 was evaluated using the above measuring methods, total light transmittance was 94.7%, haze was 65.3%, and the color breakup index (standard deviation) was 3.7. The sample 2 had no visible color breakup and a regular reflectance at 60° of 0.51%.

Experimental Example 3

The optical film 46 (the sample 3) having irregularities was obtained in a similar manner to that in the experimental example 1 except that the acrylic filler was increased to 4% by weight.

The element mean length (Rsm) of irregular structures on the front surface of the sample 3 was 4.8 μm, and the maximum cross-section height (Rz) was 5.4 μm. In addition, in a case where the sample 3 was evaluated using the above measuring methods, total light transmittance was 94.1%, haze was 75.0%, and the color breakup index (standard deviation) was 2.4. The sample 3 had no visible color breakup and a regular reflectance at 60° of 0.41%.

Experimental Example 4

The optical film 46 (the sample 4) having irregularities was obtained in a similar manner to that in the experimental example 1 except that the acrylic filler was increased to 5% by weight.

The element mean length (Rsm) of irregular structures on the front surface of the sample 4 was 5.4 μm and the maximum cross-section height (Rz) was 6.3 μm. In addition, in a case where the sample 4 was evaluated using the above measuring methods, total light transmittance was 91.0%, haze was 90.3%, and the color breakup index (standard deviation) was 1.85. The sample 4 had no visible color breakup and a regular reflectance at 60° of 0.18%.

Experimental Example 5

A flat film without irregularities (the sample 5) was obtained in a similar manner to that in the experimental example 1 except that the acrylic filler was 0% by weight.

In a case where the sample 5 was evaluated using the above methods, and total light transmittance was 95.1%, haze was 0.2%, and the color breakup index (standard deviation) was 0.8. The sample 5 had no visible color breakup and a regular reflectance at 60° of 8.41%.

Experimental Example 6

An antiglare film (the sample 6) having irregularities was obtained in a similar manner to that in the experimental example 1 except that 2% by weight of the acrylic filler having a particle diameter of 2.5 μm was mixed.

The element mean length (Rsm) of irregular structures on the front surface of the sample 6 was 27.3 μm, and the maximum cross-section height (Rz) was 2.5 μm. In addition, in a case where the sample 6 was evaluated using the above measuring methods, total light transmittance was 95.0%, haze was 25.2%, and the color breakup index (standard deviation) was 7.2. The sample 6 had visible color breakup, and a regular reflectance at 60° of 4.7%.

TABLE 1

| | Element Mean Length (RSm) (μm) | Maximum Cross-section Height | Color Break-up | Haze | Total Light Trans-mittance | Regular Reflec-tance (60°) |
|---|---|---|---|---|---|---|
| Experimental Example 1 | 6.2 | 2.1 | 4.2 | 50.1 | 95.0% | 0.93 |
| Experimental Example 2 | 6.8 | 3.3 | 3.7 | 65.3 | 94.7% | 0.51 |
| Experimental Example 3 | 4.8 | 5.4 | 2.4 | 75.0 | 94.1% | 0.41 |
| Experimental Example 4 | 5.4 | 6.3 | 1.85 | 90.3 | 91.0% | 0.18 |
| Experimental Example 5 | — | — | 0.8 | 0.2 | 95.1% | 8.41 |
| Experimental Example 6 | 27.3 | 2.5 | 7.2 | 25.2 | 95.0% | 4.7 |

The light emission area (D) of the light-emitting diode (e.g., light-emitting element 12R) of the display body device 10E used in this example is 625 μm², and the pixel area (P) is 1.59 mm² (1260 μm×1260 μm). Therefore, D/P of the display body device 10E in this example is 0.0004.

In the experimental example 5 using a film having a flat surface, although satisfactory results of color breakup, haze, and total light transmittance were obtained, the regular reflectance value was large, and reflection was observed. Further, in the experimental example 6 using the antiglare film deviating from the equations (3) to (5) described above, color breakup and glare were observed. In contrast, in the experimental examples 1 to 4 that satisfy the equations (3) to (5) described above, favorable results of all of color breakup, haze, total light transmittance, and regular reflectance were obtained.

Experiment 2

The display body device 50E was prepared in which the light source element 12 having three types of light-emitting diodes having a mean length of 25 μm as the light-emitting elements 12R, 12G, and 12B were arranged at pitches of 1.26 mm. The optical film 56 having irregular structures (the plurality of projections 56X) on the front surface was bonded onto the display body device 50E (specifically, onto the light-blocking layer 44) with a functional film interposed therebetween to fabricate samples (samples 7 to 12) for evaluation, and a tilt angle distribution, black floating, and reflection properties of the samples were measured. It is to be noted that black floating and reflection properties were measured by the following methods.

(Method of Measuring Black Floating)

A light source (ring-shaped light source) having a Lambertian orientation and having an outer diameter of 34 cm and an inner diameter of 20 cm was prepared. A light emission surface of the ring-shaped light source was disposed at a position 10 cm from a display surface, and luminance of a 1 cm×1 cm region on the display surface was measured at a position 10 cm from the display surface on a central axis of the ring-shaped light source. It is to be noted that luminance was measured using a two-dimensional luminance meter (ICAM manufactured by DWLTA). A percentage of reflected light measured by the luminance meter in the luminance of the light source is referred to as "reflectance". A larger value of reflectance indicates larger black floating, and in this experiment, reflectance of 0.40% was used as a black floating index, and an allowable range was a value equal to or less than 0.40%.

(Method of Measuring Reflection Properties)

A light source (square light source) having a Lambertian orientation and having the shape of a square 10 cm on a side was prepared. A light emission surface of the square light source is disposed at a position 30 cm from the display surface and an edge-image of reflected light of a forward light source was obtained at a distance of 30 cm from the display surface. An ESF (Edge Spread Function) was calculated from the edge image, and the edge image is differentiated to obtain an LSF. The LSF was subjected to Fourier transform to obtain an MTF (Modulation Transfer Function) curve of the reflected light. A value of the MTF curve weighted with frequency sensitivity characteristics of a human eye and integrated is defined as reflection properties. A higher value indicates stronger reflection. In this experiment, 1.9 was used as a reflection index, and an allowable range was a value equal to or less than 1.9.

In the following, configuration of optical films 56 used as experimental examples 7 to 12 and results of the tilt angle distribution, black floating, and reflection properties are described. Table 2 summarizes these results. It is to be noted that a determination result of each of black floating and reflection properties was A in a case where the value was within the above-described allowable range, and B in a case where the value was out of the allowable range.

Experimental Example 7

As the base 56A of the optical film 56, a PET film having a film thickness of 100 μm was used. In order to form irregularities on the front surface of the resin layer 56B, 10% by weight of a urethane acrylate oligomer, 20% by weight of an acrylate monomer, 2% by weight of an acrylic filler (φ5 μm), 5% by weight of a photopolymerization initiator, 51% by weight of butyl acetate, and 12% by weight of cyclohexanone were mixed and stirred to obtain a coating agent. The coating agent thus obtained was applied onto the base 56A by a die coater, dried at 80° C. for 15 minutes, and then cured by ultraviolet radiation to obtain the optical film 56 (the sample 7) having irregularities on the front surface. In a case where the irregular structures of the sample 7 were measured to obtain the tilt angle distribution, a component having a tilt angle of 30° or more accounted for 0.33%, and a component having a tilt angle of 2° or less accounted for 41.45%.

Experimental Example 8

The optical film 56 (the sample 8) having irregularities was obtained in a similar manner to that in the experimental example 1 except that solvents (51% by weight of butyl acetate and 12% by weight of cyclohexanone) of the coating agent was changed to 63% by weight of butyl acetate. In a case where the irregular structures of the sample 8 were measured to obtain the tilt angle distribution, the component having a tilt angle of 30° or more accounted for 1.04%, and the component having a tilt angle of 2° or less accounted for 6.63%.

Experimental Example 9

The optical film 56 (the sample 9) having irregularities was obtained in a similar manner to that in the experimental example 1 except that solvents (51% by weight of butyl acetate and 12% by weight of cyclohexanone) of the coating agent were changed to 63% by weight of butyl acetate, and drying conditions after the coating agent was applied was changed to 90° C. for 10 minutes. In a case where the irregular structures of the sample 9 were measured to obtain the tilt angle distribution, the component having a tilt angle of 30° or more accounted for 20.06%, and the component having a tilt angle of 2° or less accounted for 1.17%.

Experimental Example 10

The optical film 56 (the sample 10) having irregularities was obtained in a similar manner to that in the experimental example 1 except that solvents (51% by weight of butyl acetate and 12% by weight of cyclohexanone) of the coating agent were changed to 45% by weight of butyl acetate and 18% by weight of methyl ethyl ketone, and drying conditions after the coating agent was applied was changed to 90° C. for 10 minutes. In a case where the irregular structures of the sample 10 were measured to obtain the tilt angle distribution, the component having a tilt angle of 30° or more accounted for 33.11%, and the component having a tilt angle of 2° or less accounted for 0.76%.

Experimental Example 11

The optical film 56 (the sample 10) having irregularities was obtained in a similar manner to that in the experimental example 1 except that solvents (51% by weight of butyl acetate and 12% by weight of cyclohexanone) of the coating agent were changed to 45% by weight of butyl acetate and 18% by weight of methyl ethyl ketone, and drying conditions after the coating agent was applied was changed to 100° C. for 5 minutes. In a case where the irregular structures of the sample 11 were measured to obtain the tilt angle distribution, the component having a tilt angle of 30° or more accounted for 44.67%, and the component having a tilt angle of 2° or less accounted for 0.52%.

Experimental Example 12

The optical film 56 (the sample 12) having irregularities was obtained in a similar manner to that in the experimental example 1 except that the particle size of the acrylic filler was changed to φ10 μm, solvents (51% by weight of butyl acetate and 12% by weight of cyclohexanone) of the coating agent were changed to 39.5% by weight of butyl acetate and 25% by weight of methyl ethyl ketone, and drying conditions after the coating agent was applied was changed to 90° C. for 10 minutes. In a case where the irregular structures of the sample 12 were measured to obtain the tilt angle distribution, the component having a tilt angle of 30° or more accounted for 54.94%, and the component having a tilt angle of 2° or less accounted for 8.99%.

TABLE 2

| | Percentage of Tilt Angle (%) | | Black Floating | | Reflection Properties | |
|---|---|---|---|---|---|---|
| | 30° or more | 2° or less | Reflectance (%) | Determination | Reflection Properties | Determination |
| Experimental Example 7 | 0.33 | 41.45 | 0.00 | A | 6.12 | C |
| Experimental Example 8 | 1.04 | 6.63 | 0.01 | A | 1.96 | B |
| Experimental Example 9 | 20.06 | 1.17 | 0.40 | A | 0.61 | A |
| Experimental Example 10 | 33.11 | 0.76 | 0.53 | B | 0.51 | A |
| Experimental Example 11 | 44.67 | 0.52 | 0.59 | C | 0.47 | A |
| Experimental Example 12 | 54.94 | 8.99 | 0.53 | B | 6.65 | C |

As can be seen from Table 2, in the experimental example 7, the experimental example 8 and the experimental example 9 in which an angle component having an angle of 30° or more accounted for less than 33% in the tilt angle distribution of projections, the reflectance was low, and favorable results of black floating were obtained. In addition, in the experimental example 9, the experimental example 10, and the experimental example 11 in which an angle component having an angle of 2° or less accounted for less than 6.6% in the tilt angle distribution, favorable results of reflection properties were obtained. In addition, in the experimental example 9 satisfying that the angle component having an angle of 30° or more accounted for less than 33% and the angle component having an angle of 2° or less accounted for less than 6.6% in the tilt angle distribution, favorable results of both black floating and reflection properties were obtained.

Although the present technology has been described with reference to the first and second embodiments and the examples, the present technology is not limited to the foregoing embodiments and the like, and may be modified in a variety of ways. For example, the light source element 12 may have a single emission color. In this case, the display body device 10E may include color filters of a plurality of colors disposed in the openings 44H, for example.

In addition, in the first embodiment, one drive IC 13 is provided for each of the light source elements 12. However, one drive IC 13 may be provided for every two or more of the light source elements 12.

Further, in the foregoing embodiments and the like, for example, the counter substrate 10B may be omitted. Furthermore, one counter substrate 10B may be provided for each of the unit substrates 10C or each of the display body devices 10E.

In addition, the present technology is applicable not only to LED displays using LEDs as light source elements but also to liquid crystal displays (LCDs), plasma displays (Plasma Display Panels: PDPs), organic EL (Electro Luminescence) displays, inorganic EL displays, field emission displays (FEDs), and surface-conduction electron-emitter displays (SEDs).

It is to be noted that effects described in this specification are merely examples and not limitative, and other effects may be included.

In addition, the present technology may have the following configurations.

[1]

A display apparatus including:

a display body device including a plurality of pixels, the plurality of pixels each including a plurality of light-emitting elements as light source elements; and an irregular structure formed on a front surface of the display body device.

[2]
The display apparatus according to [1], in which in the display body device, a value obtained by dividing a light emission area (D) of the plurality of light-emitting elements represented by a following equation (1) by an area (P) of the pixel represented by a following equation (2) satisfies a following equation (3),

[Math. 1]

$$D = dx \times dy \qquad (1)$$

(dx: a length of a short side of the light-emitting element, dy: a length of a long side of the light-emitting element)

$$P = px \times py \qquad (2)$$

(px: a length of a short side of the pixel, py: a length of a long side of the pixel)

$$D/P \leq 004 \qquad (3).$$

[3]
The display apparatus according to [1] or [2], in which the irregular structure has surface roughness satisfying following equations (4) and (5),

[Math. 2]

$$0.1 \leq Rz/RSm \leq 2 \qquad (4)$$

(Rz: a maximum cross-section height, RSm: an element mean length)

$$RSm \leq (dx+dy)/2 \qquad (5).$$

[4]
The display apparatus according to any one of [1] to [3], in which a value obtained by dividing a light emission area (D) of the plurality of light-emitting elements by an area (P) of the pixel is 0.01 or less.

[5]
The display apparatus according to any one of [1] to [4], in which a processed image obtained by removing a frequency component derived from the pixel from an image displayed on the display body device has luminance variation (standard deviation) of 5.0 or less.

[6]
The display apparatus according to any one of [1] to [5], in which the irregular structure has total light transmittance of 85% or more and a value of diffuse transmittance/the total light transmittance of 45% or more and 95% or less.

[7]
The display apparatus according to any one of [1] to [6], in which the irregular structure has an antireflection film on a front surface.

[8]
The display apparatus according to any one of [1] to [7], in which a plurality of the pixels is provided on a wiring substrate, and
the wiring substrate includes a core substrate, and one or more buildup layers that are formed on each of both surfaces of the core substrate, and are electrically coupled to each other through a via.

[9]
The display apparatus according to any one of [1] to [8], in which a plurality of the display body devices is disposed on a supporting substrate.

[10]
The display apparatus according to [9], in which the supporting substrate comprises a metal plate.

[11]
The display apparatus according to any one of [1] to [10], further including a control circuit that controls the display body device.

[12]
The display apparatus according to any one of [1] to [11], in which in a tilt angle distribution, on a front surface of the display body device, of a plurality of projections included in the irregular structure, an angle component having an angle of 30° or more accounts for less than 33% of all the projections.

[13]
The display apparatus according to any one of [1] to [12], in which in a tilt angle distribution, on a front surface of the display body device, of a plurality of projections included in the irregular structure, an angle component having an angle of 2° or less accounts for less than 6.6% of all the projections.

[14]
The display apparatus according to any one of [1] to [13], in which in the display body device, a value obtained by dividing a light emission area (D) of the plurality of light-emitting elements represented by the equation (1) by an area (P) of the pixel represented by the equation (2) satisfies the equation (3), and the irregular structure has a surface roughness satisfying the equations (4) and (5), and in a tilt angle distribution, on a front surface of the display body device, of a plurality of projections included in the irregular structure, an angle component having an angle of 30° or more accounts for less than 33% of all the projections, and an angle component having an angle of 2° or less accounts for less than 6.6% of all the projections.

This application claims the benefit of Japanese Priority Patent Application JP2017-095294 filed with the Japan Patent Office on May 12, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A display apparatus, comprising:
a display body device including a plurality of pixels,
wherein each pixel of the plurality of pixels includes a plurality of light-emitting elements; and
an irregular structure on a front surface of the display body device,
wherein the irregular structure has a surface roughness that satisfies following equations (4) and (5),

[Math. 2]

$$0.1 \leq Rz/RSm \leq 2 \qquad (4)$$

wherein Rz: a maximum cross-section height, and RSm: an element mean length, $$RSm \leq (dx+dy)/2 \qquad (5),$$

wherein dx: a length of a short side of each light-emitting element of the plurality of light-emitting elements corresponding to each pixel of the plurality of pixels, and dy: a length of a long side of each light-emitting element of the plurality of light-emitting elements corresponding to each pixel of the plurality of pixels.

2. The display apparatus according to claim 1, wherein
a light emission area (D) of each light-emitting element of the plurality of light-emitting elements, of each pixel of the plurality of pixels, is represented by a following equation (1),
an area (P) of each pixel of the plurality of pixels is represented by a following equation (2), and
a value based on division of the light emission area (D) of each light-emitting element with the area (P) of each pixel satisfies a following equation (3)

[Math. 1]

$$D = dx \times dy \quad (1)$$

$$P = px \times py \quad (2)$$

wherein px: a length of a short side of each pixel of the plurality of pixels, and py: a length of a long side of each pixel of the plurality of pixels, and $$D/P \leq 0.04 \quad (3).$$

3. The display apparatus according to claim 1, wherein a value based on division of a light emission area (D) of each light-emitting element of the plurality of light-emitting elements with an area (P) of each pixel of the plurality of pixels is one of less than or equal to 0.01.

4. The display apparatus according to claim 1, wherein
the display body device is configured to obtain a processed image based on removal of a frequency component from image data,
the frequency component corresponds to a pixel of the image data, and
the processed image has a luminance variation one of greater than or equal to 5.0.

5. The display apparatus according to claim 1, wherein the irregular structure has:
a total light transmittance greater than or equal to 85%, and
a value of diffuse transmittance divided by the total light transmittance is:
greater than or equal to 45%, and
less than or equal to 95%.

6. The display apparatus according to claim 1, wherein the irregular structure includes an antireflection film on the front surface of the display body device.

7. The display apparatus according to claim 1, further comprising a wiring substrate, wherein
the plurality of pixels is on the wiring substrate, and
the wiring substrate includes:
a core substrate that includes a first surface and a second surface, and
at least one buildup layer on each of the first surface and the second surface, wherein a first buildup layer of the at least one buildup layer is electrically coupled to a second buildup layer of the at least one buildup layer through a via.

8. The display apparatus according to claim 1, further comprising a supporting substrate that supports the display body device.

9. The display apparatus according to claim 8, wherein the supporting substrate comprises a metal plate.

10. The display apparatus according to claim 1, further comprising a control circuit configured to control the display body device.

11. The display apparatus according to claim 1, wherein
the irregular structure includes a plurality of projections,
a tilt angle distribution of the plurality of projections includes a specific angle component,
the specific angle component includes an angle that is one of greater than or equal to 30°, and
the specific angle component corresponds to less than 33% of the plurality of projections.

12. The display apparatus according to claim 1, wherein
the irregular structure includes a plurality of projections,
a tilt angle distribution of the plurality of projections includes a specific angle component,
the specific angle component includes an angle that is one of less than or equal to 2° and
the specific angle component corresponds to less than 6.6% of the plurality of projections.

13. The display apparatus according to claim 1, wherein
the irregular structure includes a plurality of projections,
a tilt angle distribution of the plurality of projections includes:
a first angle component that includes an angle one of greater than or equal to 30°, and
a second angle component that includes an angle one of less than or equal to 2°, wherein the first angle component corresponds to less than 33% of the plurality of projections, and the second angle component corresponds to less than 6.6% of the plurality of projections, and
a light emission area (D) of each light-emitting element of the plurality of light-emitting elements, of each pixel of the plurality of pixels, is represented by a following equation (1),
an area (P) of each pixel of the plurality of pixels is represented by a following equation (2), and
a value based on division of the light emission area (D) of each light-emitting element with the area (P) of each pixel satisfies a following equation (3)

[Math. 1]

$$D = dx \times dy \quad (1)$$

$$P = px \times py \quad (2)$$

wherein px: a length of a short side of each pixel of the plurality of pixels, and py: a length of a long side of each pixel of the plurality of pixels, and $$D/P \leq 0.04 \quad (3).$$

14. A display apparatus, comprising:
a display body device including a plurality of pixels,
wherein each pixel of the plurality of pixels includes a plurality of light-emitting elements; and
an irregular structure on a front surface of the display body device,
wherein a value based on division of a light emission area (D) of each light-emitting element of the plurality of light-emitting elements with an area (P) of each pixel of the plurality of pixels is one of less than or equal to 0.01.

* * * * *